US008422837B2

(12) United States Patent
Nishi et al.

(10) Patent No.: US 8,422,837 B2
(45) Date of Patent: Apr. 16, 2013

(54) SEMICONDUCTOR DEVICE (75) Inventors: Kenichi Nishi, Tokyo (JP); Junichi Fujikata, Tokyo (JP); Jun Ushida, Tokyo (JP); Daisuke Okamoto, Tokyo (JP)

(73) Assignee: NEC Corporation, Tokyo (JP)

(*) Notice: Subject to any disclaimer, the term of this patent is extended or adjusted under 35 U.S.C. 154(b) by 227 days.

(21) Appl. No.: 12/919,546

(22) PCT Filed: Feb. 26, 2009

(86) PCT No.: PCT/JP2009/053591
§ 371 (c)(1),
(2), (4) Date: Aug. 26, 2010

(87) PCT Pub. No.: WO2009/107742
PCT Pub. Date: Sep. 3, 2009

(65) Prior Publication Data
US 2010/0320496 A1 Dec. 23, 2010

(30) Foreign Application Priority Data
Feb. 28, 2008 (JP) ................. 2008-047736

(51) Int. Cl.
*H01L 33/62* (2010.01)
(52) U.S. Cl.
USPC ............ 385/14; 257/432; 257/E25.013
(58) Field of Classification Search .......... 257/84, 257/432, 466, 85, 98, E23.01, E25.013, E27.12, 257/E27.128; 372/46.012; 385/14
See application file for complete search history.

(56) References Cited

U.S. PATENT DOCUMENTS
2002/0028045 A1* 3/2002 Yoshimura et al. ............ 385/50

FOREIGN PATENT DOCUMENTS
| JP | 2002006161 A | 1/2002 |
| JP | 2003101044 A | 4/2003 |
| JP | 2004146603 A | 5/2004 |
| JP | 2004193431 A | 7/2004 |
| JP | 2006047894 A | 2/2006 |
| JP | 2007148087 A * | 6/2007 |
| JP | 2007517248 A | 6/2007 |

OTHER PUBLICATIONS
JP 2007-148087 translation made Jul. 9, 2012.*
International Search Report for PCT/JP2009/053591 mailed Jun. 2, 2009.
K. Ohashi, "LSI On-Chip Optical Interconnect Technology", Semiconductor MIRAI Proje Results Report Meeting 2006, Dec. 2006, pp. 79-89.

* cited by examiner

*Primary Examiner* — Thomas L Dickey (57) ABSTRACT

A semiconductor device comprises a semiconductor layer having a semiconductor integrated circuit, which is for processing an electrical signal, on a semiconductor substrate and an optical interconnect layer for transmitting an optical signal are joined. Control of modulation of the optical signal transmitted in the optical interconnect layer is performed by an electrical signal from the semiconductor layer, and an electrical signal generated by reception of light in the optical interconnect layer is transmitted to the semiconductor layer. The optical interconnect layer is disposed on the underside of the semiconductor substrate.

8 Claims, 10 Drawing Sheets

SEMICONDUCTOR DEVICE

DESCRIPTION OF RELATED APPLICATION

This application is the National Phase of PCT/JP2009/053591, filed Feb. 26, 2009, which claims the benefit of previous Japanese Patent Application No. 2008-047736 (filed on Feb. 28, 2008), which is hereby incorporated by reference herein in its entirety.

TECHNICAL FIELD

The present invention relates to a semiconductor device in which a semiconductor layer that includes a semiconductor integrated circuit for processing an electrical signal and an optical interconnect layer for transmitting a light signal are joined to make signal transmission possible. More particularly, the invention relates to a semiconductor device in which an optical interconnect layer is disposed on the underside of a semiconductor layer.

BACKGROUND

Reduction in transistor size has been accompanied by a higher degree of integration in semiconductor integrated circuits and by continuing improvements in the speed at which electrical signals are processed. In relation to signal transmission by electrical interconnects (wiring traces) in a semiconductor integrated circuit, and in particular with regard to global interconnects, which are comparatively long-haul interconnects within the chip, problems such as wiring delay, signal skew (a difference in reception times) and jitter (fluctuation) are arising. Further problems are signal degradation due to crosstalk between adjacent electrical interconnects and the effects of electromagnetic noise from the surroundings of the semiconductor integrated circuit.

Techniques for substituting an optical interconnect structure for some of the electrical interconnects of a semiconductor integrated circuit continue to be developed as method of solving the above-mentioned problems. A method of fabrication in which an optical interconnect layer formed on a substrate separate from a semiconductor integrated circuit is bonded to an electrical interconnect layer has been proposed as such a technique.

For example, Non-Patent Document 1 discloses forming a semiconductor integrated circuit composed of transistors or the like on a semiconductor substrate made of Si or the like, on the other hand forming an optical interconnect layer incorporating a waveguide and a transceiver element, etc., forming pads for electrical connections on respective ones of the side on which the semiconductor integrated circuit has been formed and the side of the optical interconnects, and forming a final device by electrically connecting between the pads.

Further, Patent Document 1 discloses ones obtained by implementing an interlayer connection, through use of interlayer vias, between a semiconductor chip mounted on a first main surface of a resin layer and an optical chip embedded in a second main surface of the resin layer. A connection terminals and bumps are formed on the optical chip on the surface thereof facing the side of the optical chip, and the opposite side (the underside) has no connection terminal. As a result, it is disclosed that since the semiconductor chip and the optical chip are connected over a short distance, parasitic capacitance, which is produced by the connection between the semiconductor chip and the optical chip, can be reduced.

Patent Document 1

Japanese Patent Kokai Publication No. JP2004-146603A

Non-Patent Document 1

Keishi Ohashi, "LSI On-Chip Optical Interconnect Technology", Semiconductor MIRAI Project Results Report Meeting 2006, December 2006, pp. 79-89

SUMMARY

The particulars disclosed in the above-mentioned Patent Document 1 and Non-Patent Document 1 are hereby incorporated by reference herein in their entirety. The analysis below is given by the present invention.

With the method of fabrication in which an optical interconnect layer formed on a substrate separate from a semiconductor integrated circuit is bonded to an electrical interconnect layer, as in the prior art, pads (connection terminals) of the semiconductor chip for supplying power to the semiconductor integrated circuit and extracting electrical signals from the semiconductor integrated circuit exist on the optical-interconnects side. A problem which arises as a consequence is that the surface area for extracting the electrical signals is small and the number of pads is limited. Accordingly, an exchange of electrical signals between the semiconductor integrated circuit in the semiconductor chip and the outside, supply of power and a ground connection, etc., are limited.

It is a primary object of the present invention to secure a number of pads for an exchange of electrical signals between the semiconductor integrated circuit in the semiconductor chip and the outside, supply of power and a ground connections, etc., while maintaining high-speed optical signal transmission.

In one aspect of the present invention, there is provided a semiconductor device, characterized in that a semiconductor layer having a semiconductor integrated circuit, which is for processing an electrical signal, on a semiconductor substrate and an optical interconnect layer for transmitting an optical signal are joined, control of modulation of the optical signal transmitted in the optical interconnect layer is performed by the electrical signal from the semiconductor layer, and an electrical signal generated by reception of light in the optical interconnect layer is transmitted to the semiconductor layer; wherein the optical interconnect layer is disposed on the underside of the semiconductor substrate.

In accordance with the present invention, owing to the fact that the optical interconnects are provided on the underside of the semiconductor substrate, high-speed signal transmission within the device is performed by transmission of the optical signal in the optical interconnect layer provided on the underside of the semiconductor substrate, while electrical connections for an exchange of electrical signals with the outside, supply of power and connection to ground, etc., can be assured on the surface of the semiconductor integrated circuit.

PREFERRED MODES FOR CARRYING OUT THE INVENTION

Figure 1:
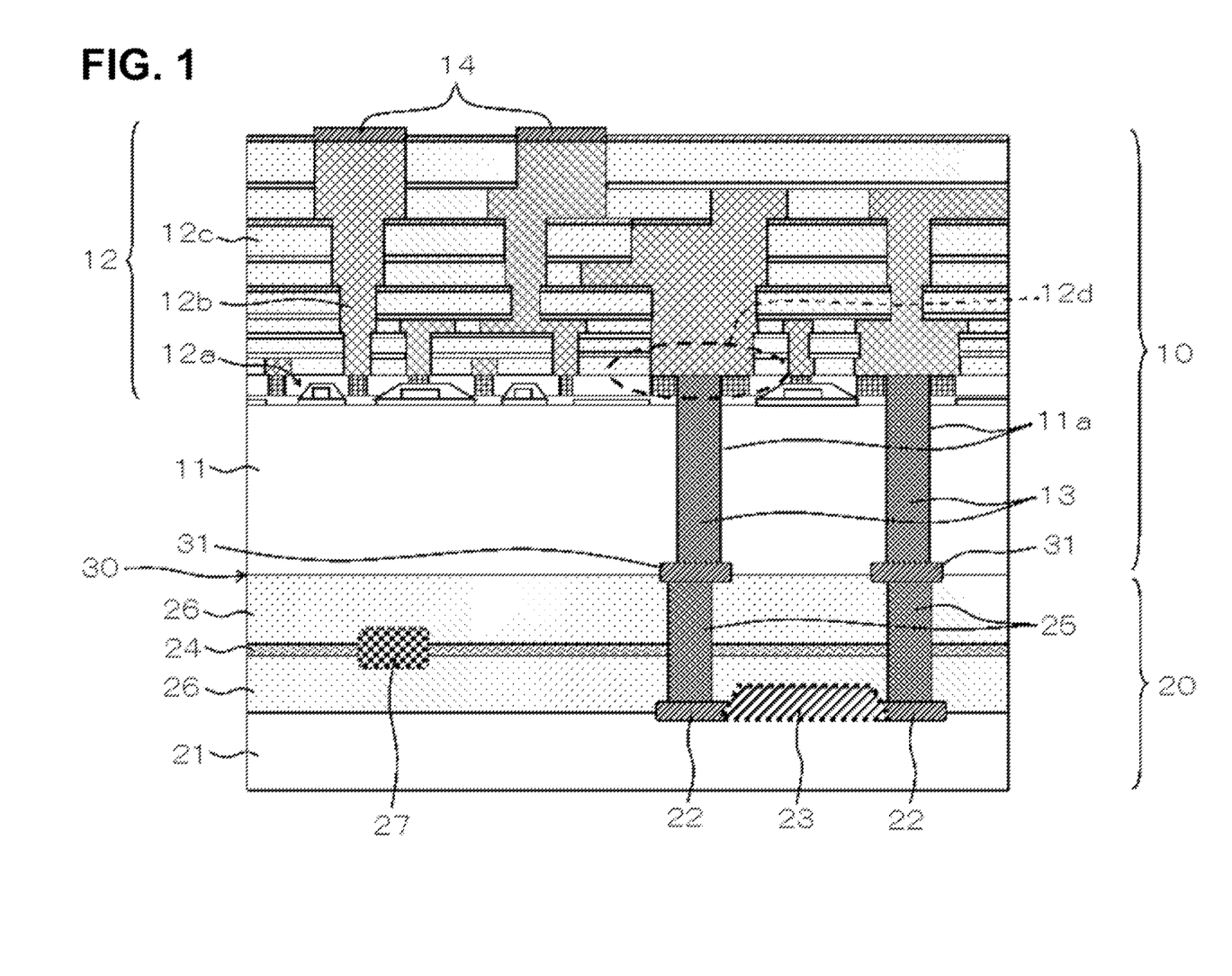
FIG. 1 is a partial sectional view schematically illustrating the configuration of a semiconductor device according to a first example of the present invention.

In an example of the present invention, a semiconductor device is such that a semiconductor layer (10 in FIG. 1) having a semiconductor integrated circuit (12 in FIG. 1), which is for processing an electrical signal, on a semiconductor substrate (11 in FIG. 1) and an optical interconnect layer (20 in FIG. 1) for transmitting an optical signal are joined, control of modulation of the optical signal transmitted in the optical interconnect layer (20 in FIG. 1) is performed by an electrical signal from the semiconductor layer (10 in FIG. 1), and an electrical signal generated by reception of light in the optical interconnect layer (20 in FIG. 1) is transmitted to the semiconductor layer (10 in FIG. 1), wherein the optical interconnect layer (20 in FIG. 1) is disposed on the underside of the semiconductor substrate (11 in FIG. 1) [namely on the side thereof opposite the semiconductor integrated circuit (12 in FIG. 1] (mode 1).

The modes below are possible as well.

Preferably, the optical interconnect layer is bonded to the underside of the semiconductor substrate (mode 1-1).

Preferably, the semiconductor integrated circuit has an interconnect area for transmitting an electrical signal to be converted to an optical signal, the semiconductor substrate has a through-hole leading from the underside of the semiconductor substrate to the interconnect area, an electrical conductor electrically connected to an interconnect of the interconnect area is formed within the through-hole, and a distal end of the electrical conductor on the underside of the semiconductor substrate has a pad portion for being electrically connected to the optical interconnect layer (mode 1-2).

Preferably, the interior of the through-hole has an insulator between the semiconductor substrate and the electrical conductor (mode 1-3).

Preferably, on the underside of the semiconductor substrate, the diameter of the through-hole is relatively large in comparison with the diameter thereof on the surface side of the semiconductor substrate (mode 1-4).

Preferably, the electrical conductor is a metal via structure formed by plating from the underside of the semiconductor substrate (mode 1-5).

Preferably, the semiconductor integrated circuit has an interconnect area for transmitting an electrical signal to be converted to an optical signal, the semiconductor substrate has a bottomed hole formed so as to thin the semiconductor substrate from the underside thereof, and has a through-hole, which leads to the interconnect area, within an area on the bottom of the bottomed hole, an insulator is embedded within the bottomed hole and the through-hole, a hole leading from the underside to the interconnect area is formed in the insulator, an electrical conductor electrically connected to an interconnect of the interconnect area is formed within this hole, and a distal end of the electrical conductor on the underside of the insulator has a pad portion for being electrically connected to the optical interconnect layer (mode 1-6).

Preferably, the insulator is composed of an oxide film of a main constituent element of the semiconductor substrate or an organic compound (mode 1-7).

Preferably, the surface of the semiconductor integrated circuit is formed to have an electrode pad for supplying power to the semiconductor integrated circuit externally or for externally extracting an electrical signal from the semiconductor integrated circuit (mode 1-8).

FIRST EXAMPLE

Figure 2:
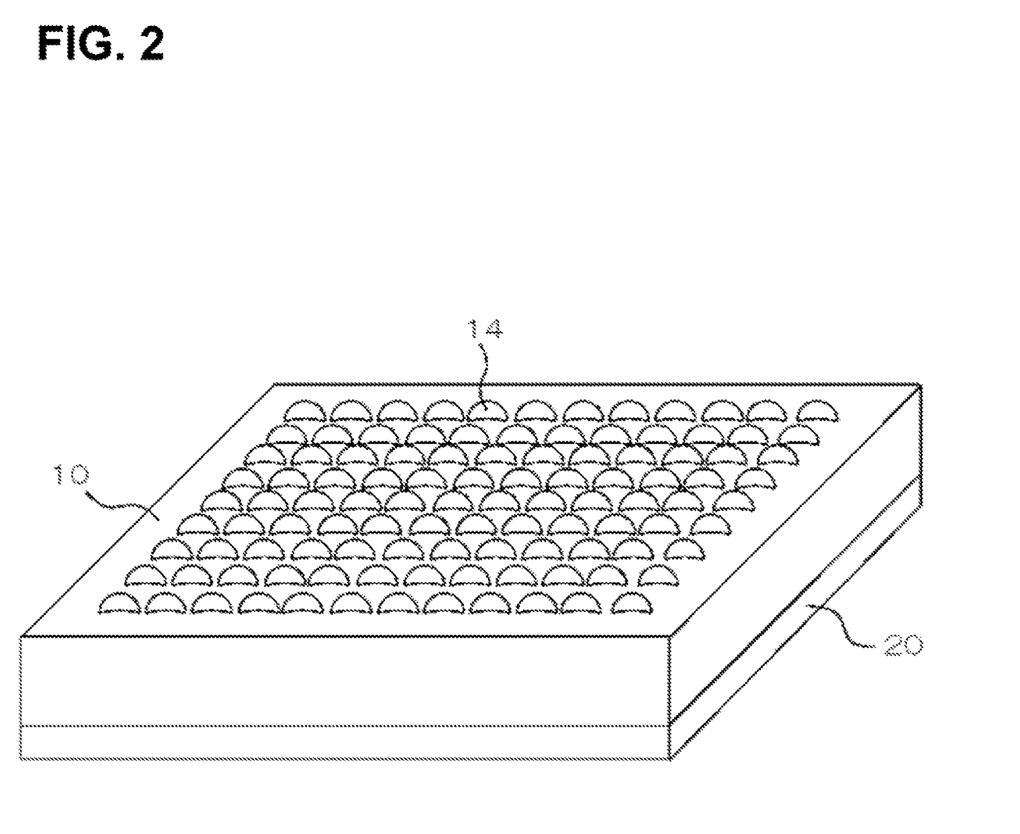
FIG. 2 is an external perspective view schematically illustrating the configuration of a semiconductor device according to the first example of the present invention.

A semiconductor device according to a first example of the present invention will be described with reference to the drawings. FIG. 1 is a partial sectional view schematically illustrating the configuration of a semiconductor device according to a first example of the present invention. FIG. 2 is an external perspective view schematically illustrating the configuration of the semiconductor device according to the first example of the present invention.

With reference to FIG. 1, the semiconductor device according to the first example is such that a semiconductor layer 10 having a semiconductor integrated circuit 12 on a semiconductor substrate 11 and an optical interconnect layer 20 for transmitting an optical signal are joined to make signal transmission possible. The semiconductor device is such that the electrical connection between the semiconductor integrated circuit 12 and the outside is achieved on the surface side of the semiconductor integrated circuit 12 on the semiconductor substrate 11, and the transmission of an optical signal is performed on the side of the semiconductor substrate 11 that is opposite the semiconductor integrated circuit 12 (namely on the underside of the semiconductor substrate). The semiconductor device is such that among the electrical signals handled in the semiconductor integrated circuit 12, an electrical signal that is to be transmitted to a location a comparatively long distance away is transmitted upon being converted to an optical signal in the optical interconnect layer 20. The semiconductor device is such that the optical interconnect layer 20 is provided on the semiconductor substrate 11 on the side thereof opposite the semiconductor integrated circuit 12 (namely on the underside of the semiconductor integrated circuit). The semiconductor device is such that the surface of the semiconductor integrated circuit 12 is formed to have an electrode pad 14 for supplying power to the semiconductor integrated circuit 12 externally and for externally extracting electrical signals from the semiconductor integrated circuit 12.

The semiconductor layer 10 has the semiconductor integrated circuit 12, which is for processing electrical signals, on the semiconductor substrate 11.

The semiconductor substrate 11 has a pad portion 31 disposed on the underside thereof, and is formed to have a hole (through-hole) 11a leading from the pad portion 31 to an interconnect area 12d of the semiconductor integrated circuit 12. The hole 11a is filled with an electrical conductor (via) 13. The electrical conductor 13 is electrically connected to the pad portion 31 and to interconnect 12b of the interconnect area 12d. The underside of the semiconductor substrate 11 serves as a bond interface 30 with the surface of an insulating layer 26 of the optical interconnect layer 20.

In the semiconductor integrated circuit 12, by way of example, a transistor 12a (e.g., a CMOS device) is formed on the semiconductor substrate 11, and an insulating layer (e.g., silicon oxide film or silicon nitride film) 12c is formed on the semiconductor substrate 11 that includes the transistor 12a. In the insulating layer 12c, interconnect 12b (inclusive of a contact plug, via and interconnect layer) is formed from an electrode (e.g., gate electrode, source-drain electrodes) of the transistor(s) 12a to a level that connects the interior of the semiconductor integrated circuit 12 in its entirety. The interconnect area 12d, which is for transmitting an electric signal between the semiconductor integrated circuit and a light-receiving element 23 of the optical interconnect layer 20 is formed, and an electrode pad 14 is formed on the interconnect 12b (global interconnect of the uppermost portion).

The interconnect area 12d is placed at a prescribed position outside the region in which the transistor 12a is formed, and the interconnect 12b, which is for transmitting an electric signal to the optical interconnect layer 20, and the electrical conductor 13 are electrically connected.

With regard to the electrical conductor 13, basically there is no particular limitation concerning material and method of fabrication so long as an electrical signal is conducted. For high-speed transmission of electrical signals, however, metal is preferable since low resistance is favorable. Further, with regard to formation of a low-resistance metal via over the length of penetration of the semiconductor substrate 11, it is particularly beneficial if the metal electrical conductor 13 is implemented by plating.

The electrode pads 14 are for supplying power to the semiconductor integrated circuit 12 externally and for externally extracting an electrical signal from the semiconductor integrated circuit 12.

The optical interconnect layer 20 is a wiring board for optical transmission incorporating basic components that make possible an optical connection, such as a light-receiving element 23, an optical waveguide 24 and an optical modulator 27, etc. The optical interconnect layer 20 is bonded to the underside of the semiconductor substrate 11. The optical interconnect layer 20 converts an electrical signal from the semiconductor integrated circuit 12 in the semiconductor layer 10 to an optical signal, transmits the converted optical signal (long-haul transmission), converts an optical signal to an electrical signal and transmits the converted electrical signal to the semiconductor integrated circuit 12 in semiconductor layer 10. As for the optical interconnect layer 20, electrodes 22 and the light-receiving element 23 are formed on a substrate 21 (e.g., a silicon substrate), and the light-receiving element 23 and electrodes 22 are electrically connected. An insulating layer 26 (e.g., a silicon oxide film) is formed on the substrate 21 that includes the electrodes 22 and light-receiving element 23. An optical waveguide 24 and an optical modulator 27 are formed in the middle region of the insulating layer 26. The optical waveguide 24 transmits an optical signal from the optical modulator 27. An electrical conductors (vias) 25 whole size (diameter) is the same as that of the electrical conductors 13 are formed in the insulating layer 26. The electrode(s) 22 and the pad portion(s) 31 are electrically connected via the electrical conductor(s) 25. The pad portion(s) 31 is(are) placed at a prescribed position(s) on the bond boundary 30 between the underside of the semiconductor substrate 11 and the surface of the insulating layer 26 of optical interconnect layer 20. Further, although not illustrated, an electrical conductors (vias) electrically connecting the optical modulator 27 and the semiconductor layer 10 (a portion similar to the pad portion 31) are formed in the insulating layer 22. The light-receiving element 23 converts an optical signal from the optical modulator 27 to an electrical signal and outputs the converted electrical signal toward the semiconductor integrated circuit 12 in the semiconductor layer 10. The optical modulator 27 converts an electrical signal from the semiconductor integrated circuit 12 in semiconductor layer 10 to an optical signal and outputs the converted optical signal toward the light-receiving element 23 through the optical waveguide 24 and insulating layer 26. A photodiode in which Si is used as absorbing material can be employed as the light-receiving element 23. A structure in which SiON is the core and $SiO_2$ is the clad can be employed as the optical waveguide 24.

With reference to FIG. 2, the electrode pads 14 are formed on the surface side of the semiconductor layer 10 and the optical interconnect layer 20 is bonded to the underside of the semiconductor layer 10. As illustrated in the drawing, it is possible to supply power from the electrode pads 14 to the semiconductor integrated circuit and to externally extract (taken out) an electrical signal from the semiconductor integrated circuit in the semiconductor layer 10 in a manner similar to that of an semiconductor integrated circuit having only electrical connections and no optical interconnects. Further, with regard to the optical interconnect layer 20, it is formed on the underside of the semiconductor layer 10 and hence there is no particular limitation regarding its size.

Figure 3:
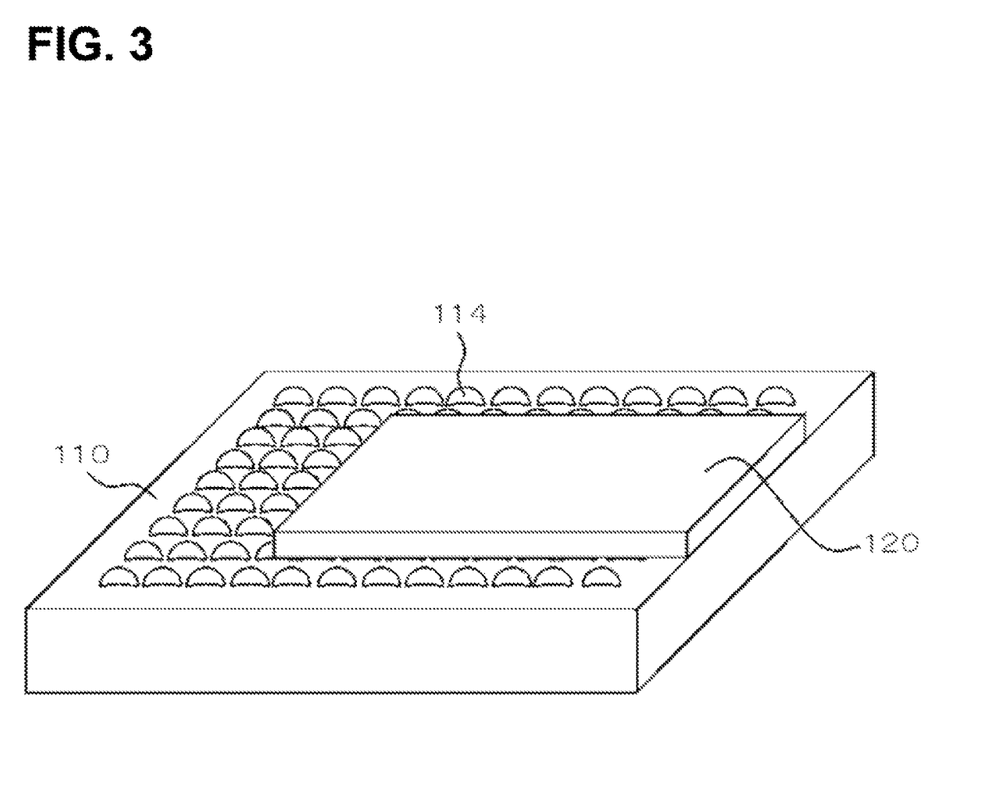
FIG. 3 is an external perspective view schematically illustrating the configuration of a semiconductor device according to a conventional example.

With reference to FIG. 3, in an arrangement in which an optical interconnect layer 120 is provided on the surface side of a semiconductor layer 110, as in the conventional art, the optical interconnect layer 120 covers electrode pads 114 located in a prescribed area on the surface of the semiconductor layer 110. Consequently, it is difficult to form the electrode pads 114 on the surface side of the semiconductor layer 110. Even if electrode pads 114 are formed on the surface side of the semiconductor layer 110, they can only be formed on a portion of the surface. Further, consider the dimensions of the optical interconnect layer 120. If dimensions that will cover the entire surface of the semiconductor layer 110 are adopted, it will not be possible to form the electrode pads 114 directly on the surface side of the semiconductor layer 110. As a result, it will be necessary to make the dimensions of the optical interconnect layer 120 smaller than those of the semiconductor layer 110 or to enlarge the dimensions of the semiconductor layer 110 in such a manner that formation of the electrode pads 114 will be possible.

Next, a method of manufacturing a semiconductor device according to the first example of the present invention will be described with reference to the drawings. FIGS. 4 to 7 are process sectional views for describing the method of manufacturing the semiconductor device according to the first example of the present invention.

Figure 4:
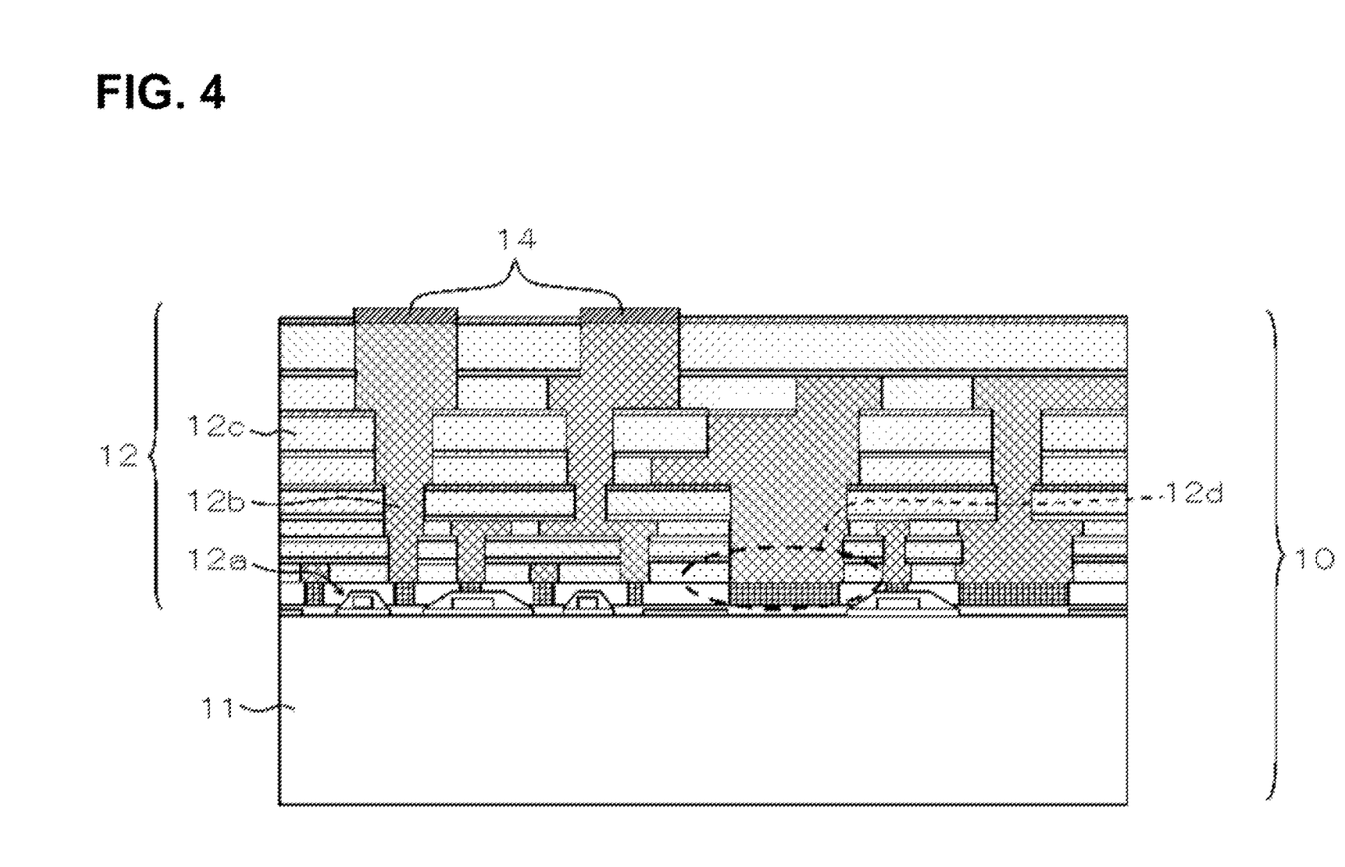
FIG. 4 is a first process sectional view for describing a method of manufacturing a semiconductor device according to the first example of the present invention.

First, prepared in the semiconductor integrated circuit 12 on semiconductor substrate 11 is a semiconductor layer 10 in which is formed the interconnect area 12d for transmitting the electrical signal for conversion to the optical signal to the optical interconnect layer (20 in FIG. 1) (step A1; see FIG. 4).

Figure 5:
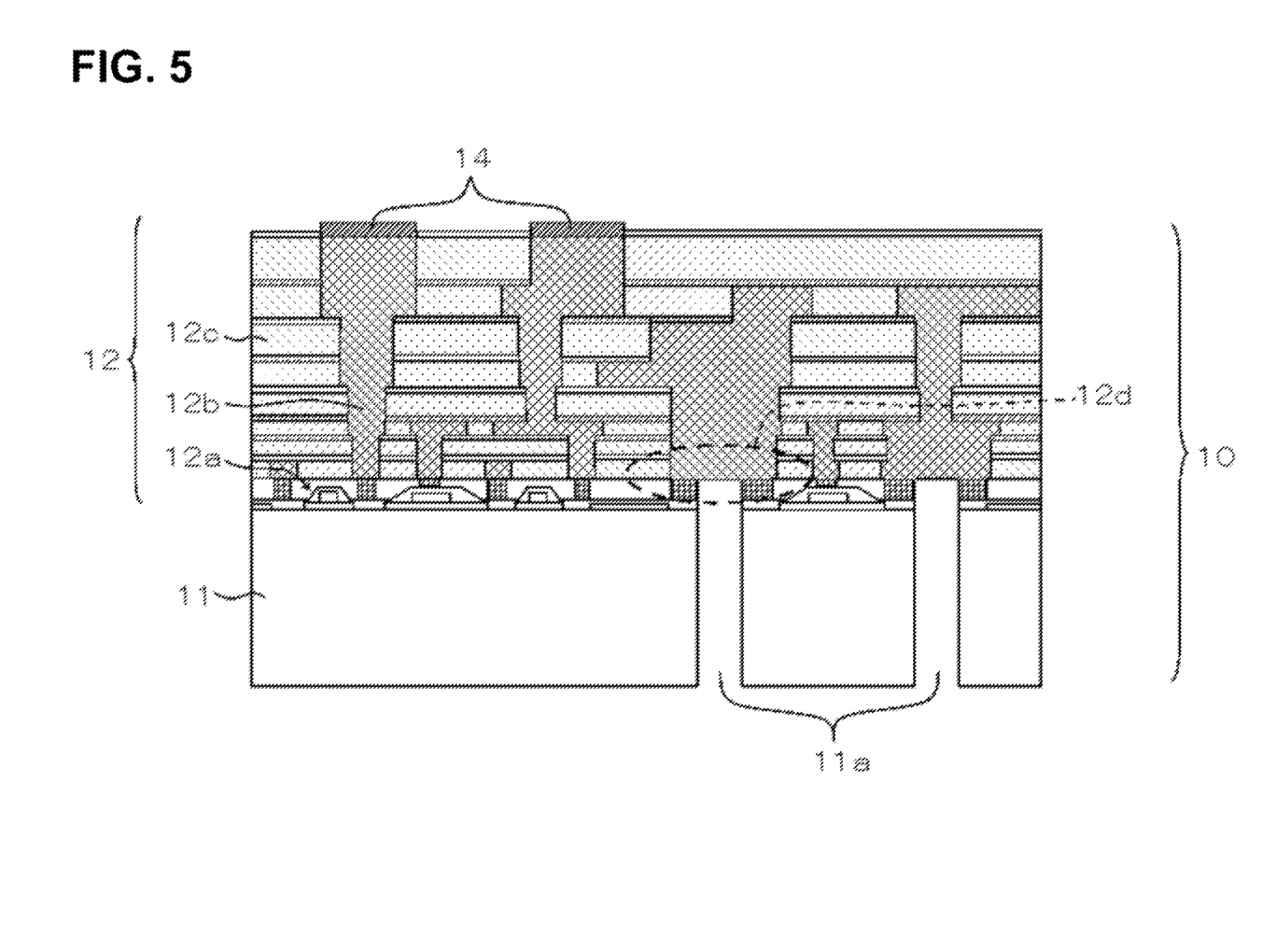
FIG. 5 is a second process sectional view for describing a method of manufacturing a semiconductor device according to the first example of the present invention.

Next, the hole(s) 11a that lead to the interconnect 12b of interconnect area 12d is(are) formed from the underside of the semiconductor substrate 11 by patterning, such as etching, and working (step A2; see FIG. 5). This is a working technique used at the time of implementation, etc., of the multilayer stacked structure in the semiconductor integrated circuit 12.

Figure 6:
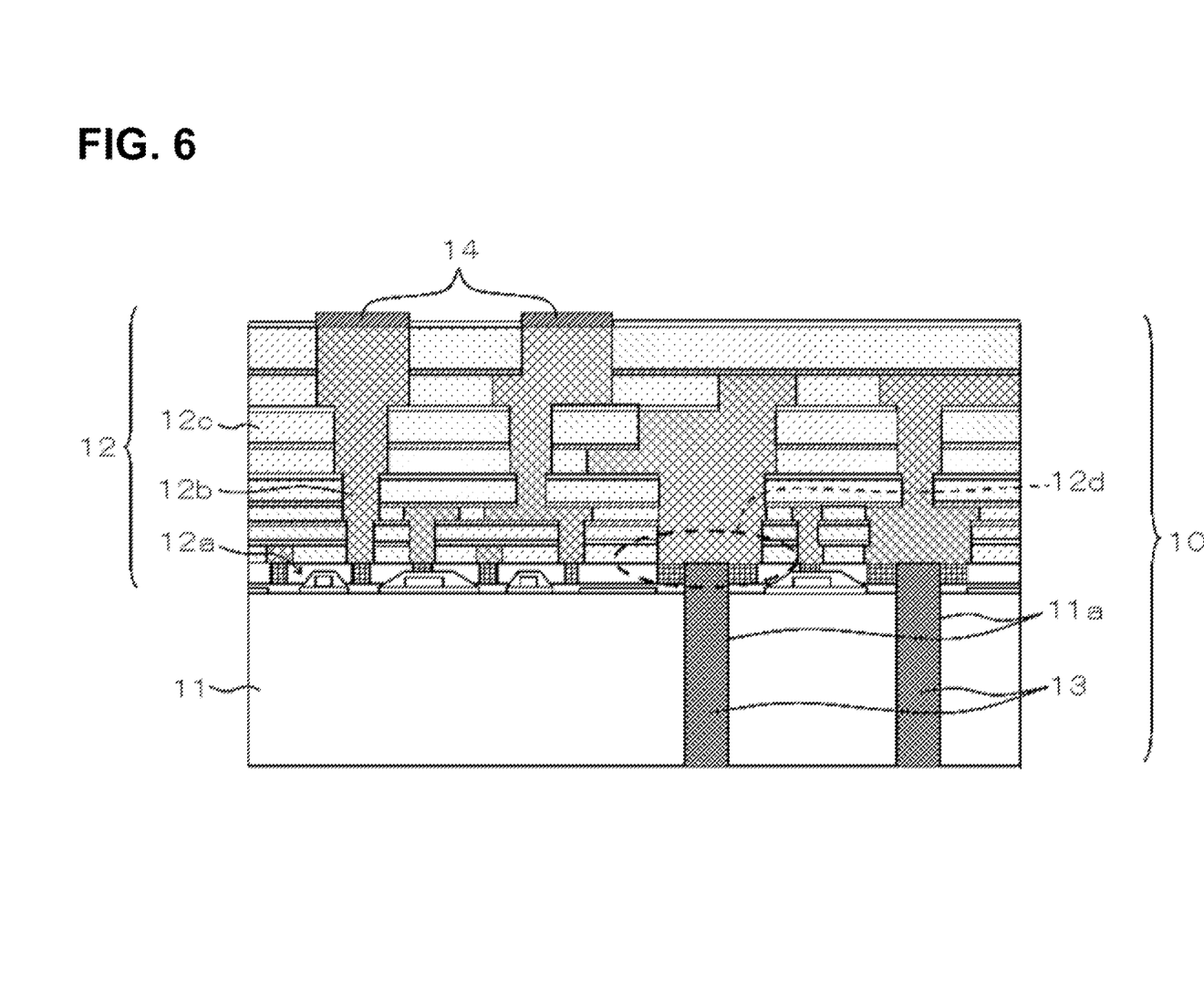
FIG. 6 is a third process sectional view for describing a method of manufacturing a semiconductor device according to the first example of the present invention.

Next, the electrical conductor 13 is embedded in the hole(s) 11a formed in the semiconductor substrate 11 (step A3; see FIG. 6). Many techniques such as vapor deposition can be used as a technique for embedding the electrical conductor 13. Accordingly, in order to form the electrical conductor 13 of good quality even if the thickness of the semiconductor substrate 11 is somewhat large, excellent effects will be obtained if use is made of a plating method. Further, an insulator (not shown) can be formed between the electrical conductor 13 and the semiconductor substrate 11. By forming such insulator (not shown), it is possible to remove the influence of current that flows through the semiconductor substrate 11. This is advantageous in terms of improving the quality of signal transmission.

Figure 7:
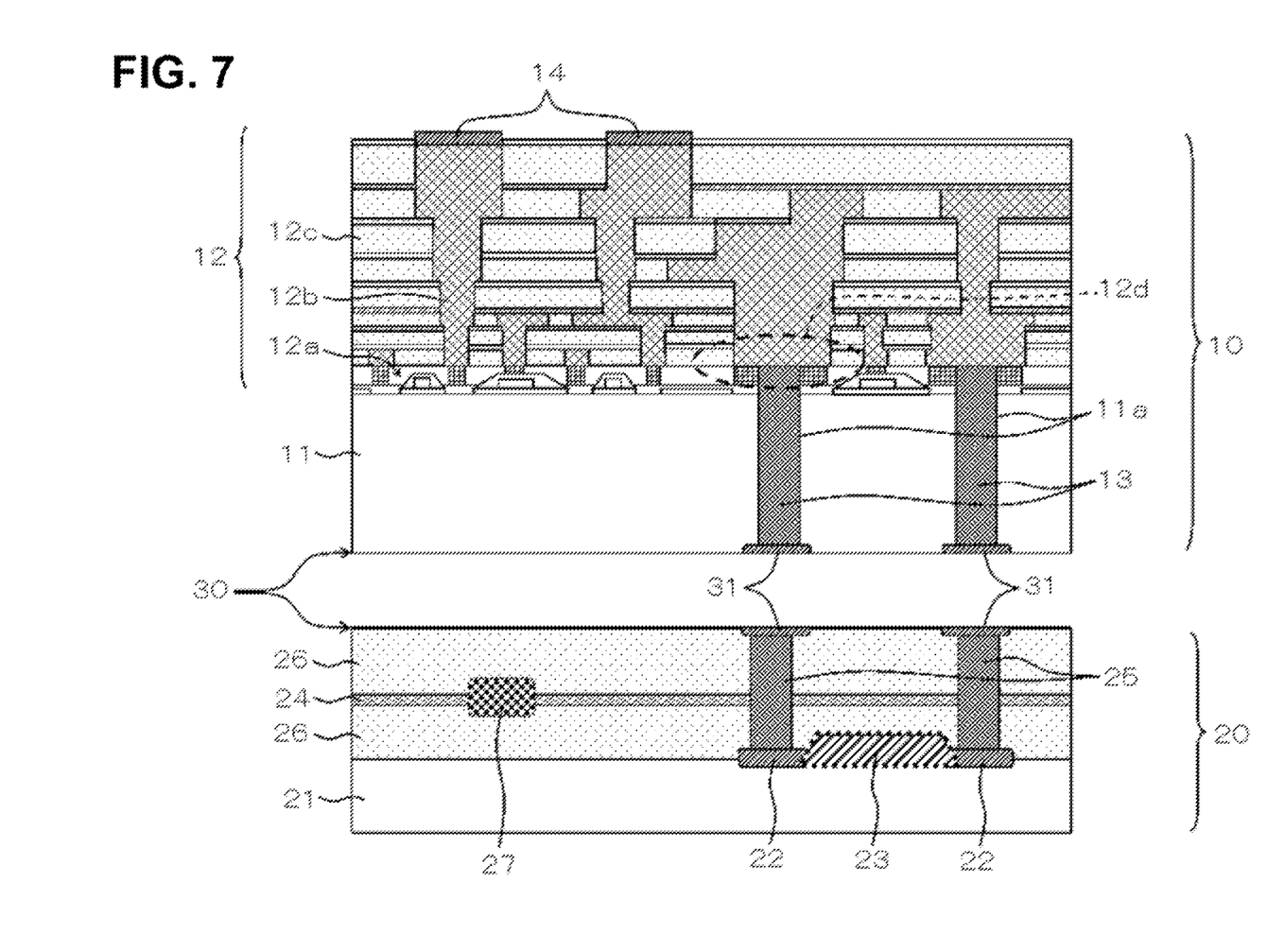
FIG. 7 is a fourth process sectional view for describing a method of manufacturing a semiconductor device according to the first example of the present invention.

Next, the pad portion(s) 31 is(are) formed on the distal end of electrical conductor 13 on the underside of the semiconductor substrate 11 (step A4; see FIG. 7). Further, the optical interconnect layer 20 is prepared independently of the semiconductor layer 10, and the pad portion(s) 31 is(are) formed on the distal end of the electrical conductor 25, which is to be connected to the semiconductor integrated circuit 12, on the side of the semiconductor substrate 11 (see FIG. 7).

Finally, the semiconductor layer 10 and optical interconnect layer 20 shown in FIG. 7 are bonded in such a manner that the pad portions 31 come into abutting contact with each other (step A5). As a result, a semiconductor device having the optical interconnect structure illustrated in FIG. 1 is realized.

In accordance with the first example, the optical interconnect layer 20 is disposed on the surface of the semiconductor substrate 11 on the side thereof opposite the semiconductor integrated circuit 12, and the semiconductor integrated circuit 12 and optical interconnect layer 20 are electrically connected through the electrical conductor(s) 13 disposed passing through the semiconductor substrate 11. As a result, high-speed signal transmission within the chip can be realized by transmission of optical signals in optical interconnect layer 20, which plays the role of global wiring, while the surface side of the semiconductor integrated circuit 12 possesses the electrode pads 14 for exchange of electrical signals with the outside, supply of power and connection to ground. In other words, the electrode pads 14, which are used for electrical signals from the semiconductor integrated circuit 12 and for supplying power to the transistors 12a can be formed on the surface of the semiconductor integrated circuit 12.

SECOND EXAMPLE

Figure 8:
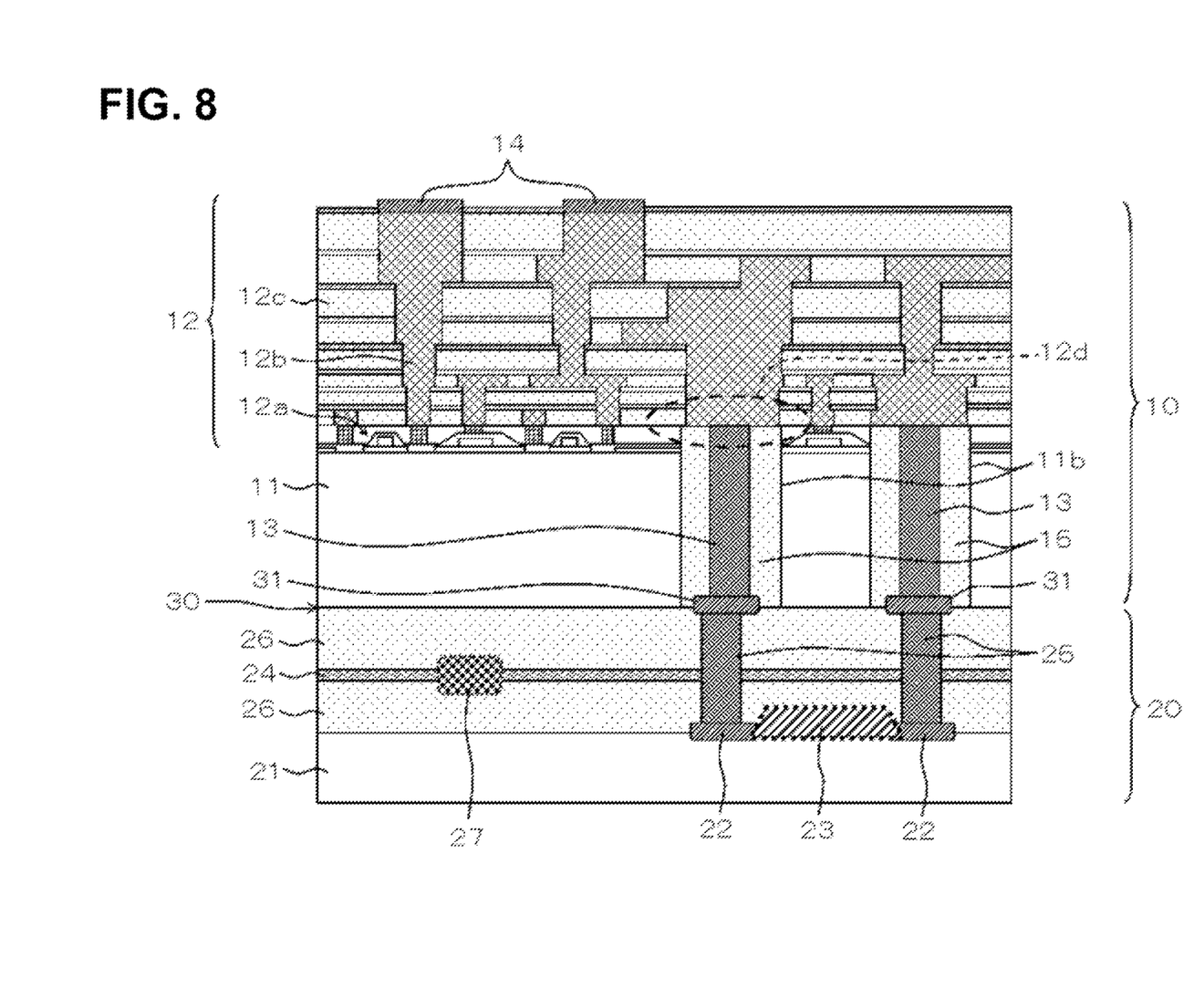
FIG. 8 is a partial sectional view schematically illustrating the configuration of a semiconductor device according to a second example of the present invention.

A semiconductor device according to a second example of the present invention will be described with reference to the drawings. FIG. 8 is a partial sectional view schematically illustrating the configuration of a semiconductor device according to a second example of the present invention.

In the second example, an insulator 15 is formed between the semiconductor substrate 11 and the electrical conductor 13 within a hole 11b of the semiconductor substrate 11. As the insulator layer 15 use can be made of an oxide film (e.g., silicon oxide film) of a main constituent element of the semiconductor substrate 11 or an insulating organic compound. Other constituents are similar to those of the first example.

With regard to the method of manufacturing the semiconductor device according to the second example, in the process for forming the insulator 15 at step A3 (see FIG. 6) of the first example, it will suffice to form the insulator 15 on the side wall of the hole 11b of semiconductor substrate 11 before the electrical conductor 13 is formed and then fill the hole with the electrical conductor 13. Other steps are similar to those of the first example.

As examples of other methods, the insulator 15 can be formed by oxidizing the surface of the hole 11b of semiconductor substrate 11 and then filling the hole with the electrical conductor 13. Further, the hole 11b having dimensions greater than those of the electrical conductor 13 can be formed in the semiconductor substrate 11, the hole can be filled with the insulator 15, a hole leading to the interconnect area 12d can then be formed in the insulator 15, and then the interior of the hole of the insulator 15 can be filled with the electrical conductor 13.

Figure 9:
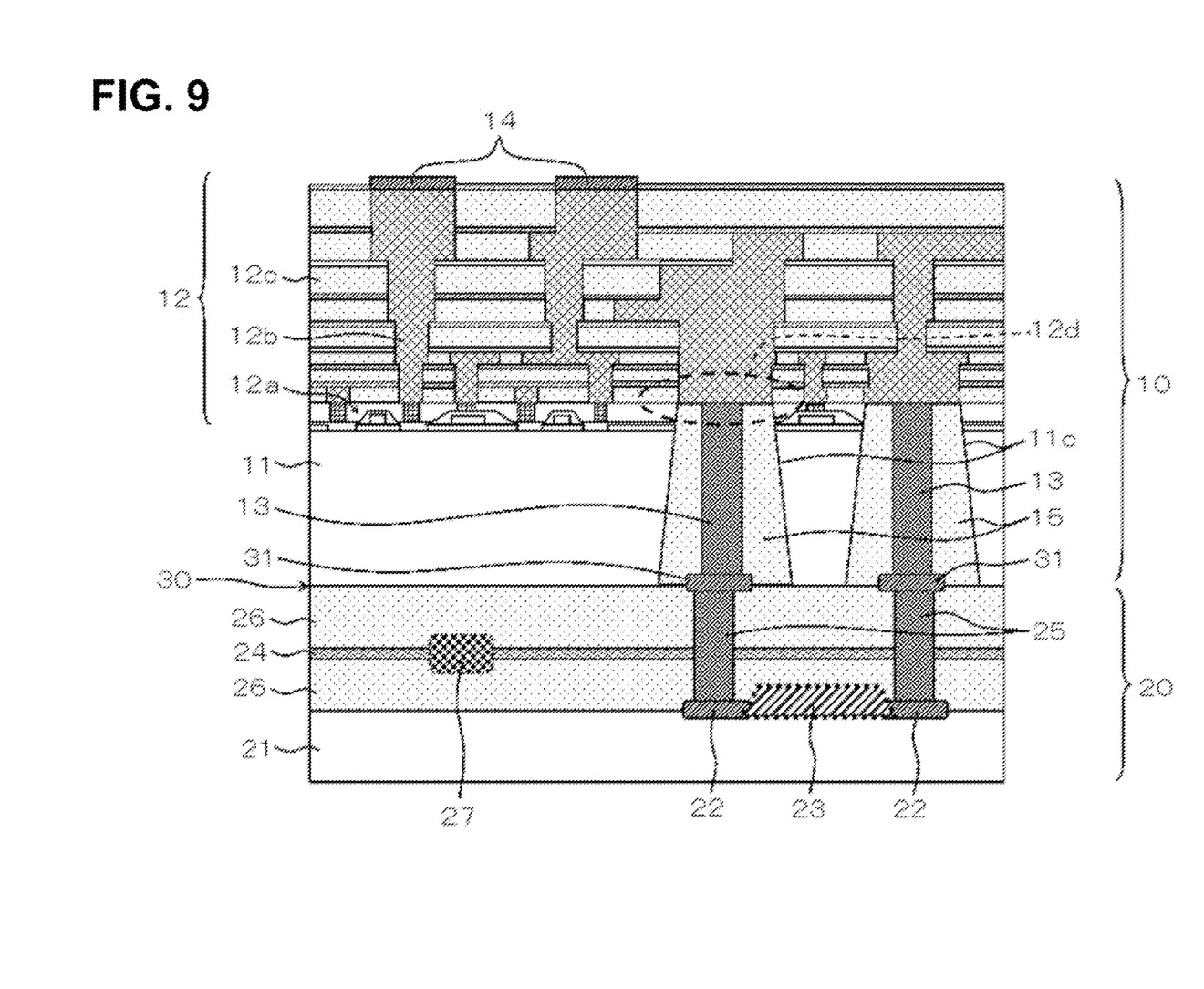
FIG. 9 is a partial sectional view schematically illustrating a modification of the configuration of a semiconductor device according to the second example of the present invention.

Further, as a structure that facilitates fabrication while reducing the capacitance between the semiconductor substrate 11 and the electrical conductor 13, making the size of the insulator 15 on the underside of the semiconductor substrate 11 (the side of the optical interconnect layer 20) relatively larger in comparison with the surface side (the side of the semiconductor integrated circuit 12) is effective (see FIG. 9). With regard to the cross section of the insulator 15, the diameter on the underside of the semiconductor substrate 11 is 1.5 times greater than the diameter on the surface side. In the fabrication of this structure, no problems arise even if the perpendicularity of the hole 11c with respect to the underside of the semiconductor substrate 11 is somewhat diminished in the formation thereof.

With regard to the electrical conductor 13, basically there is no particular limitation concerning material and method of fabrication so long as an electrical signal is transmitted. For high-speed transmission of electrical signals, however, metal is preferable since low resistance is favorable. Further, with regard to formation of a low-resistance metal via over the length of penetration of the semiconductor substrate 11, it is particularly beneficial if the metal electrical conductor 13 is implemented by plating.

In accordance with the second example, effects similar to those of the first example are obtained. In addition, with regard to the electric signals transmitted to the optical interconnect layer 20 through the electrical conductor 13, an effect obtained is a reduction in leakage to the semiconductor substrate 11. Further, in a case where high-speed electric signals are transmitted, there are instances where the capacitance of a capacitor formed by the electrical conductor 13 offers problem. In the second example, however, this capacitance can be reduced by providing the insulator 15. As a result, electrical signals of higher speed can be exchanged between the semiconductor layer 10 and the optical interconnect layer 20, and a semiconductor device having an optical interconnect structure that converts a high-speed optical signal to an electrical signal and that operates at high speed while using the high-speed optical signal is realized.

THIRD EXAMPLE

Figure 10:
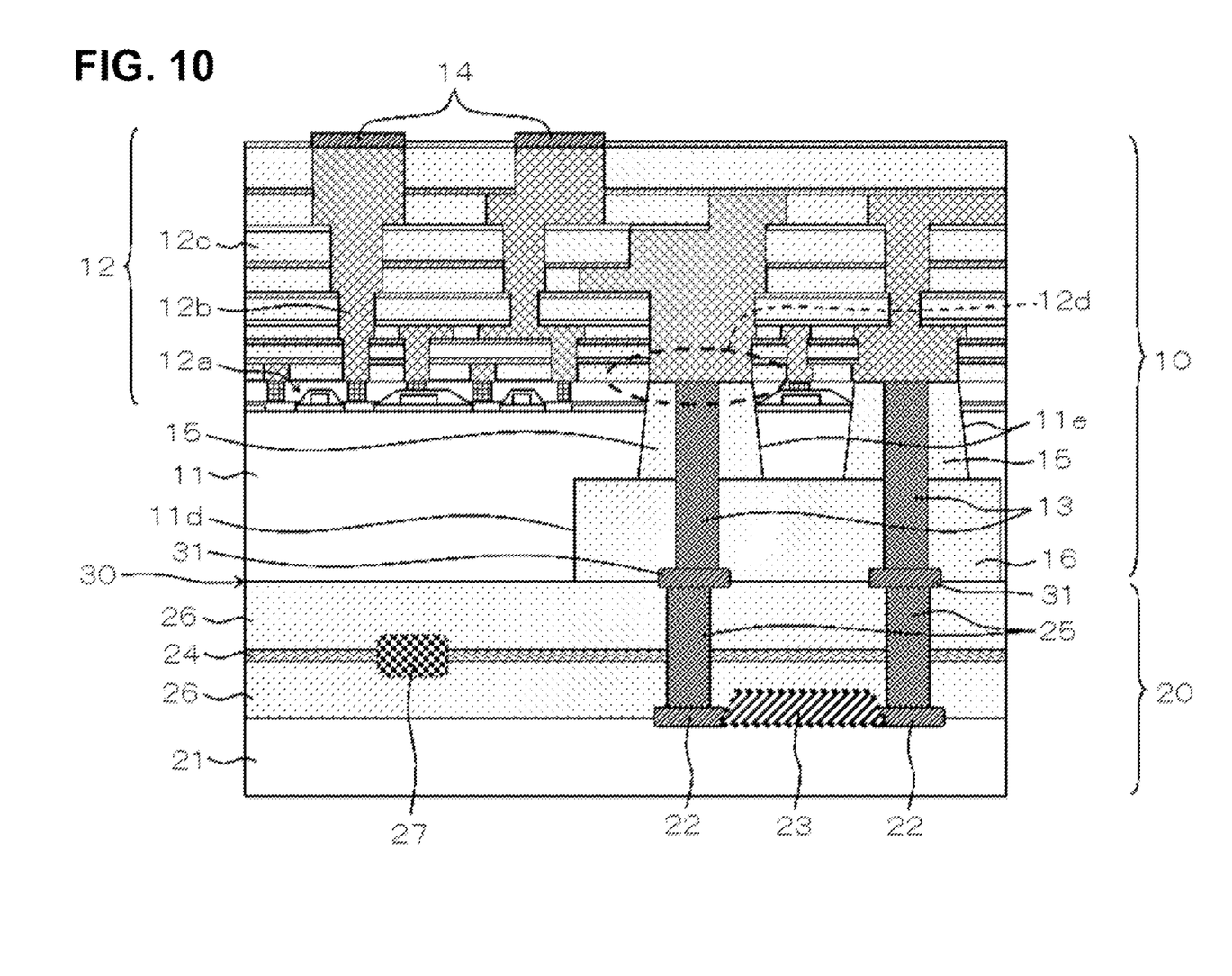
FIG. 10 is a partial sectional view schematically illustrating the configuration of a semiconductor device according to a third example of the present invention.

A semiconductor device according to a third example of the present invention will be described with reference to the drawings. FIG. 10 is a partial sectional view schematically illustrating the configuration of a semiconductor device according to a third example of the present invention.

In a third example, a hole (recess) 11d is formed in such a manner that the semiconductor substrate 11 in an area in which the electrical conductor 13 is formed is thinned from the underside of the semiconductor substrate 11, a hole 11e leading to the interconnect area 12d is formed within an area on the bottom of the hole 11d, the insulator 15 is embedded in the hole 11e, an insulator 16 is embedded in the hole 11d, and the electrical conductor 13 is embedded in through-holes formed in the insulators 15, 16, whereby the interconnect 12b of the interconnect area 12d and the pad portion 31 are electrically connected via the electrical conductor 13. As the insulators 15, 16 use can be made of an oxide film (e.g., silicon oxide film) of a main constituent element of the semiconductor substrate 11 or an insulating organic compound. Other constituents are similar to those of the first example.

With regard to the method of manufacturing the semiconductor device according to the third example, in the process for forming the hole in step A2 (see FIG. 5) of the first example, a portion of the underside of the semiconductor substrate 11 is made a thin film to thereby form the bottomed hole (recess) 11d, after which the hole 11e leading to the interconnect area 12d is formed within an area on the bottom of the hole 11. Next, in the process for forming the insulator 15 at step A3 (see FIG. 6) of the first example, the insulator 15 is embedded in the hole 11e, after which the insulator 16 is embedded to a degree that flattens (makes flush with) the underside of the semiconductor substrate 11. Thereafter, a hole leading to the interconnect area 12d is formed in the insulators 15, 16, after which the hole in the insulators 15, 16 is filled with the electrical conductor 13. Other steps are similar to those of the first example.

In accordance with the third example, advantages similar to those of the first and second examples are obtained. In addition, in the fabrication process, the insulator 15 in the portion near the semiconductor integrated circuit 12 no longer requires to be fabricated over the entire thickness of the semiconductor substrate 11. This is advantageous in terms of the process. Further, the distance between the electrical capacitance produced by one electrical conductor 13 and the other electrical conductor 13 can be increased overall by the insulator 16. This is advantageous with regard to transmission of high-speed signals by reduced capacitance.

It should be noted that even if the material of the insulator 16 is the same as that of the insulator 15 used initially, no particular difficulties arise. From the standpoint of the process of embedding a wide area of the hole (recess) 11d of semiconductor substrate 11, a structure of lower cost is obtained if an organic compound is used rather than an oxide film.

The examples of the present invention are as set forth above. The details of the semiconductor integrated circuit and optical interconnect layer are not a requirement for specifying the present invention. Further, there is no particular limitation with regard to the material and structure of the waveguide and optical elements of the optical interconnect layer. Furthermore, with regard also to the electrical conductor within the semiconductor substrate and the surrounding insulator, a low-resistance conductor and a highly reliable insulator are desirable in practice but the materials, etc., need not be specified.

Within the bounds of the entire disclosure of the present invention (inclusive of the scope of the claims), it is possible to modify and adjust the modes and examples of the invention based upon the fundamental technical idea of the invention. Multifarious combinations and selections of the various disclosed elements are possible within the bounds of the scope of the claims of the present invention. That is, it goes without saying that the invention covers various modifications and changes that would be obvious to those skilled in the art in accordance with the full disclosure and technical idea inclusive of the scope of the claims.

What is claimed is:

1. A semiconductor device, comprising:
   semiconductor layer having a semiconductor integrated circuit, which is for processing an electrical signal, on an upper side of a semiconductor substrate and an optical interconnect layer for transmitting an optical signal are joined,
   control of modulation of the optical signal transmitted in said optical interconnect layer being performed by the electrical signal from said semiconductor layer, and an electrical signal generated by reception of light in said optical interconnect layer being transmitted to said semiconductor layer;
   wherein said optical interconnect layer is disposed on an underside of the opposite side to the upper side of said semiconductor substrate,
   wherein said semiconductor integrated circuit is formed to have an electrode pad for supplying power to said semiconductor integrated circuit externally or for externally extracting an electrical signal from said semiconductor integrated circuit, on the opposite side to the said semiconductor substrate side of said semiconductor integrated circuit.

2. A semiconductor device according to claim 1, wherein said optical interconnect layer is bonded to the underside of the semiconductor substrate.

3. A semiconductor device according to claim 1, wherein said semiconductor integrated circuit has an interconnect area for transmitting an electrical signal to be converted to an optical signal; and
   said semiconductor substrate has a through-hole leading from the underside of said semiconductor substrate to said interconnect area, an electrical conductor electrically connected to an interconnect of said interconnect area is formed within said through-hole, and a distal end of said electrical conductor on the underside of said semiconductor substrate has a pad portion for being electrically connected to said optical interconnect layer.

4. A semiconductor device according to claim 3, wherein the interior of said through-hole has an insulator between said semiconductor substrate and said electrical conductor.

5. A semiconductor device according to claim 3, wherein, on the underside of said semiconductor substrate, the diameter of said through-hole is relatively large in comparison with the diameter thereof on the upper side of said semiconductor substrate.

6. A semiconductor device according to claim 3, wherein said electrical conductor is a metal via structure formed by plating from the underside of said semiconductor substrate.

7. A semiconductor device comprising:
   a semiconductor layer having a semiconductor integrated circuit, which is for processing an electrical signal, on a semiconductor substrate and an optical interconnect layer for transmitting an optical signal are joined,
   control of modulation of the optical signal transmitted in said optical interconnect layer being performed by the electrical signal from said semiconductor layer, and an electrical signal generated by reception of light in said optical interconnect layer being transmitted to said semiconductor layer;
   wherein said optical interconnect layer is disposed on the underside of said semiconductor substrate,
   wherein said semiconductor integrated circuit has an interconnect area for transmitting an electrical signal to be converted to an optical signal; and
   said semiconductor substrate has a bottomed hole formed so as to thin said semiconductor substrate from the underside thereof, and has a through-hole, which leads to said interconnect area, within an area on the bottom of said bottomed hole, an insulator is embedded within said bottomed hole and said through-hole, a hole leading from the underside to said interconnect area is formed in said insulator, an electrical conductor electrically connected to an interconnect of said interconnect area is formed within said hole, and a distal end of said electrical conductor on the underside of said insulator has a pad portion for being electrically connected to said optical interconnect layer.

8. A semiconductor device, comprising:

a semiconductor layer having a semiconductor integrated circuit, which is for processing an electrical signal, on a semiconductor substrate and an optical interconnect layer for transmitting an optical signal are joined, control of modulation of the optical signal transmitted in said optical interconnect layer being performed by the electrical signal from said semiconductor layer, and an electrical signal generated by reception of light in said optical interconnect layer being transmitted to said semiconductor layer;

wherein said optical interconnect layer is disposed on the underside of said semiconductor substrate, wherein the interior of said through-hole has an insulator between said semiconductor substrate and said electrical conductor, wherein said insulator is composed of an oxide film of a main constituent element of said semiconductor substrate or an organic compound.

* * * * *